United States Patent
Shih et al.

(10) Patent No.: US 7,459,518 B2
(45) Date of Patent: Dec. 2, 2008

(54) THERMOPLASTIC POLYIMIDE COMPOSITION

(75) Inventors: Shu-Chu Shih, Hsinchu (TW);
Charng-Shing Lu, Hsinchu (TW);
Jinn-Shing King, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 169 days.

(21) Appl. No.: 11/543,123

(22) Filed: Oct. 5, 2006

(65) Prior Publication Data
US 2007/0276086 A1 Nov. 29, 2007

(30) Foreign Application Priority Data
May 25, 2006 (TW) .............. 95118585 A

(51) Int. Cl.
*C08G 73/10* (2006.01)
*C08G 69/16* (2006.01)
*C08K 3/26* (2006.01)
*C08K 3/34* (2006.01)
*C08K 3/36* (2006.01)

(52) U.S. Cl. .............. 528/353; 528/27; 528/188; 524/425; 524/451

(58) Field of Classification Search ............ 524/425, 524/451; 528/27, 188, 353
See application file for complete search history.

(56) References Cited

U.S. PATENT DOCUMENTS

| | | | | |
|---|---|---|---|---|
| 4,927,736 A | * | 5/1990 | Mueller et al. ............ | 430/275.1 |
| 5,072,262 A | * | 12/1991 | Uekita et al. .............. | 257/410 |
| 5,677,393 A | * | 10/1997 | Ohmori et al. ............. | 525/423 |
| 6,011,113 A | * | 1/2000 | Konabe ..................... | 524/805 |
| 6,031,168 A | * | 2/2000 | Damm ....................... | 84/380 B |
| 6,379,784 B1 | | 4/2002 | Yamamoto et al. | |
| 7,118,798 B2 | * | 10/2006 | Goda et al. ................. | 428/209 |

FOREIGN PATENT DOCUMENTS

| | | |
|---|---|---|
| JP | 8-230103 A | 9/1996 |
| JP | 10-733 A | 1/1998 |
| JP | 11-277699 A | 10/1999 |
| JP | 2002-240195 A | 8/2002 |
| JP | 2003-71982 A | 3/2003 |
| JP | 2003-200527 A | 7/2003 |
| JP | 2004-42579 A | 2/2004 |

* cited by examiner

*Primary Examiner*—Tae H Yoon
(74) *Attorney, Agent, or Firm*—Birch, Stewart, Kolasch & Birch, LLP

(57) ABSTRACT

A thermoplastic polyimide composition, comprising a silane-modified polyimide (A); and a polar solvent (B), wherein the silane-modified polyimide (A) is obtained by reacting a polyimide (a) and an epoxy-containing silane (b). The polyimide (a) contains repeating units represented by the general formulae I and II, wherein the molar fraction of the repeating unit of formula II is at least 10%, X represents a quadrivalent aromatic group, $Ar^1$ represents a bivalent aromatic group, and $Ar^2$ represents a bivalent aromatic group containing an OH or COOH group.

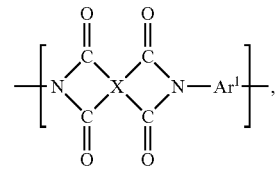

I

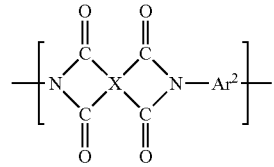

II

13 Claims, 1 Drawing Sheet

THERMOPLASTIC POLYIMIDE COMPOSITION

BACKGROUND OF THE INVENTION

1. Field of the Invention

The invention relates to thermoplastic polyimide (PI), and in particular to a thermoplastic PI with superior heat resistance and dimensional stability, suitable for fabrication of adhesiveless doubled-sided flexible copper clad laminate (FCCL).

2. Description of the Related Art

With recent rapid progresses in miniaturization and high integration of electronic devices using flexible printed wiring boards, there is an increasing demand for double-sided laminates to cope with the trend toward lighter and higher-density circuits. Conventional double-sided clad laminates include PI base film coated with adhesives such as epoxy or urethane resin on both sides. The use of adhesives, however, increases the thickness of the final device, making it undesirable for use in fine pitch circuits. Moreover, adhesives can cause curling or result in poor dimensional stability and solder resistance. To overcome these problems, adhesiveless double-sided clad laminate has been proposed.

There are various methods for fabricating adhesiveless double-sided clad laminate, one of which is direct lamination of tri-layer polyimide with two copper foils. The tri-layer polyimide typically includes a polyimide base film between two thermoplastic polyimide (TPI) layers for adhesive. The tri-layer structure can be formed by coating the TPI layer, PI base film, and TPI layer sequentially, as disclosed in U.S. Pat. No. 6,379,784, Japanese Patent Publication Nos. 2004-042579, 2003-071982, and 2002-240195. The coating quality and appearance are affected by many factors, such as the design of coating heads, fluid and physical properties of the coating materials, and B-stage baking conditions. Alternatively, the tri-layer structure can be formed by coating TPI layers on both sides of a PI base film, such as kapton E, or Apical NPI.

The PI base film can be subjected to surface treatment to improve adhesion to TPI layers. Typical surface treatment includes plasma treatment and coating amino-silane coupling agent, such as disclosed in Japanese Patent Publication Nos. 11-277699, and 08-230103.

In addition, the TPI layer can be modified by silane or epoxy to increase adhesion. For example, Japanese Patent Publication No. 2003-200527 discloses a silane modified polyimide fabricated by reacting polyamic acid or polyimide with an epoxy group-containing alkoxysilane. Japanese Patent Publication No. 10-000733 discloses an epoxy modified polyimide. A mixture of polyimide siloxane containing OH or COOH groups and aromatic epoxy is applied on both sides of a PI base film and laminated with two copper foils. After lamination, thermal annealing is required, e.g., 160° C. for 1 hour, to allow the reaction of OH or COOH groups with epoxy to increase adhesion, which increases processing time and costs.

BRIEF SUMMARY OF THE INVENTION

An object of the invention is to provide a thermoplastic polyimide composition with superior adhesion and solder resistance.

To achieve the above and other objects, an exemplary thermoplastic polyimide composition comprises a silane-modified polyimide (A); and a polar solvent (B), wherein the silane-modified polyimide (A) is obtained by reaction of a polyimide (a) and an epoxy-containing silane (b). The polyimide (a) contains repeating units represented by formulae I and II, wherein the molar fraction of the repeating unit of formula II is at least 10%, X represents a quadrivalent aromatic group, $Ar^1$ represents a bivalent aromatic group, and $Ar^2$ represents a COOH— or OH-containing bivalent aromatic group.

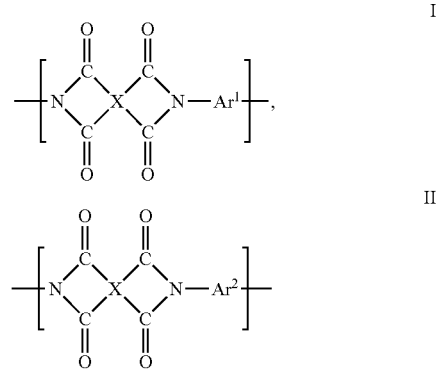

Another object of the invention is to provide a method for fabricating a double-sided flexible copper clad laminate, wherein a thermal treatment is not required after lamination of copper foils, thereby saving processing time and costs.

To achieve the above and other objects, an exemplary method for fabricating a double-sided flexible copper clad laminate comprises providing a solution containing the disclosed polyimide (a); reacting the polyimide (a) with an epoxy-containing silane (b) to form a silane-modified polyimide (A); applying the silane-modified polyimide (A) on both sides of a polyimide base film; and laminating two copper foils on both sides of the polyimide base film by thermal pressing, thereby providing the double-sided flexible copper clad laminate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
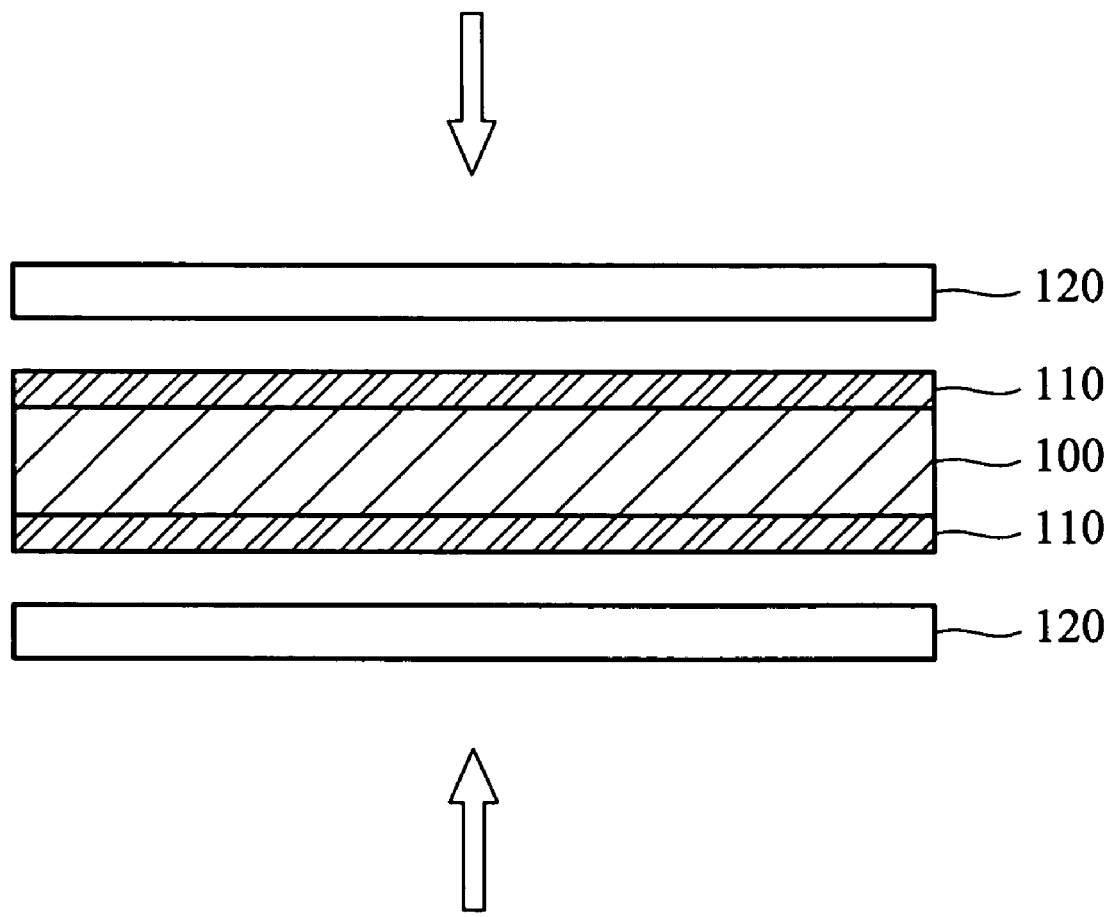
FIG. 1 is a cross section showing a method for fabricating an adhesiveless double-sided copper clad laminate according to a preferred embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a thermoplastic polyimide composition suitable for use as adhesives in fabricating double-sided copper clad laminate. The thermoplastic polyimide provides superior adhesion during lamination of copper foils and the PI base film, thus improving dimensional stability and heat resistance of the laminate.

According to the invention, the thermoplastic polyimide composition includes a silane-modified polyimide (A) and a polar solvent (B), wherein the silane-modified polyimide (A) is obtained by reaction of a polyimide (a) and an epoxy-containing silane (b).

The polyimide (a) is a copolymer containing repeating units represented by formulae I and II, and the molar fraction of the repeating unit of formula II is at least 10%, preferably between 30-60%.

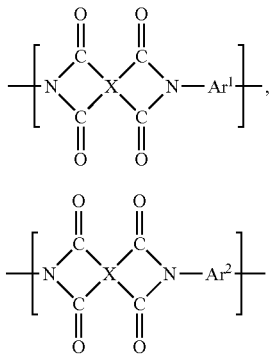

X represents a quadrivalent aromatic group. Preferred examples of X include, but are not limited to:

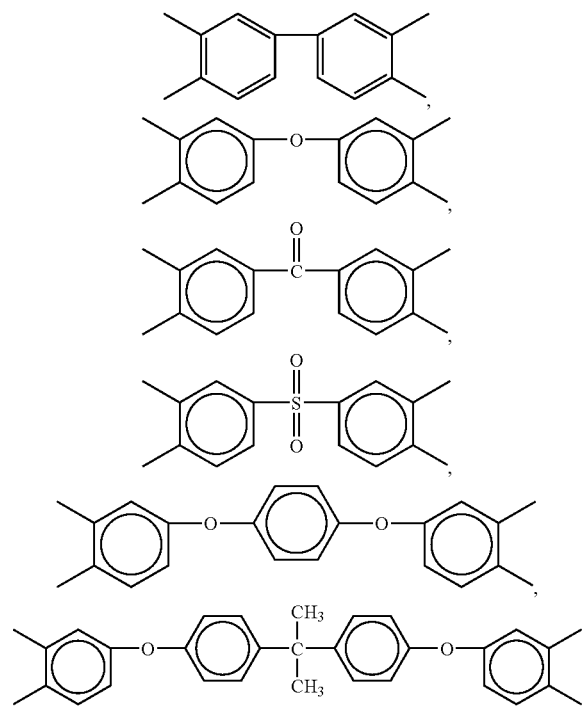

Ar¹ represents a bivalent aromatic group. Preferred examples of Ar¹ include, but are not limited to:

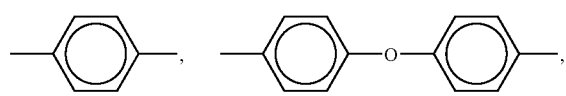

-continued

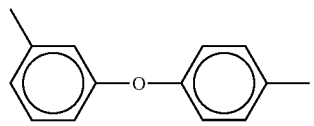

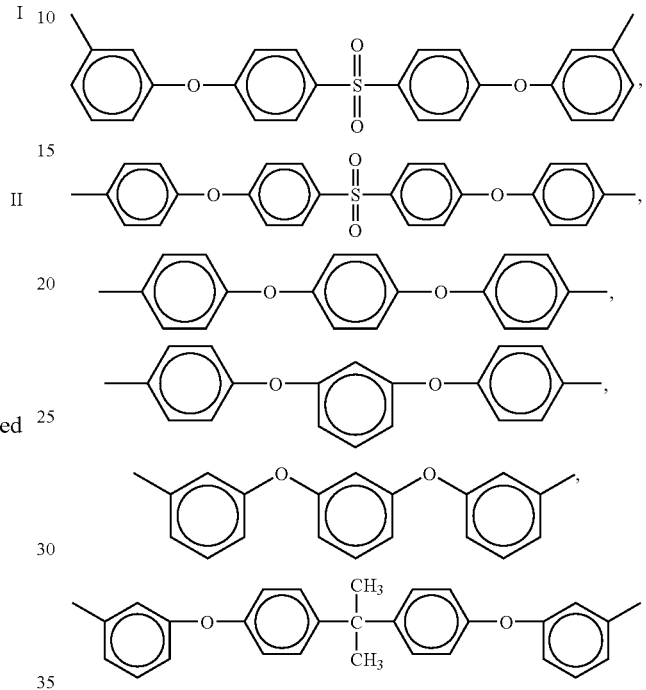

Ar² represents a COOH— or OH-containing bivalent aromatic group. Preferred examples of Ar¹ include, but are not limited to:

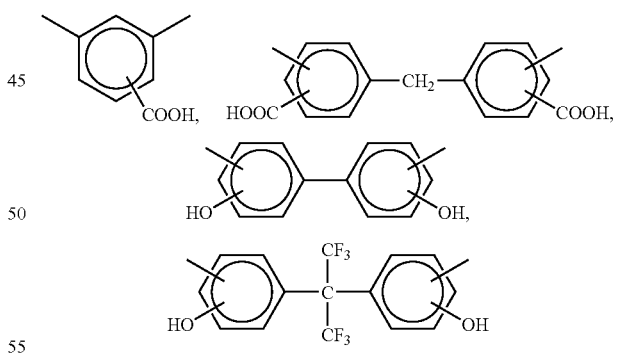

In preferred embodiments, the silane-modified polyimide (A) has a solid content of about 15-30% by weight. The silane-modified polyimide (A) is prepared by reaction of the carboxyl (—COOH) or hydroxyl (—OH) group of Ar² of the polyimide (a) with an epoxy-containing silane (b). The epoxy-containing silane (b) is preferably a non-aromatic epoxy alkoxysilane such as epoxycyclohexyl alkoxysilane, or glycidoxypropyl alkoxysilane. Illustrative examples include β-(3,4-epoxycyclohexyl)ethyltrimethoxysilane), γ-glycidoxypropyl-trimethoxysilane, and γ-glycidoxypropyl-methyldiethoxysilane (their formula structures are listed below).

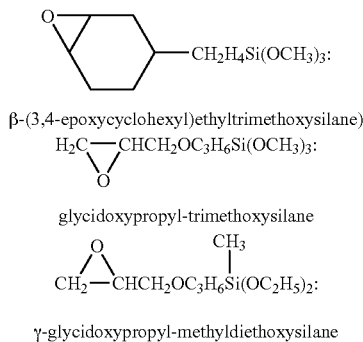

β-(3,4-epoxycyclohexyl)ethyltrimethoxysilane glycidoxypropyl-trimethoxysilane

γ-glycidoxypropyl-methyldiethoxysilane

The polar solvent (B) particularly suitable for use in the invention includes, for example, N-methyl-2-pyrrolidone (NMP), N,N-dimethylacetamide (DMAc), γ-butyrolactone (GBL), xylene, toluene, or combinations thereof. It should be noted, however, any polar solvent suitable for polyimide can be used for the invention.

A preferable procedure for preparing the polyimide is now described. First, predetermined amounts of diamine and dianhydride monomers are dissolved in a solvent (e.g., NMP). After stirring for few hours, another solvent (e.g., toluene) is added to give an azeotrope solvent mixture and heated to reflux at about 180° C. for 1-3 hours. After cooling, the content of the polyimide in the solution is preferably controlled at about 15-30% by weight. Thereafter, an epoxy-containing silane and a catalyst (e.g., triphenylphosphine; TPP) are added and the desired thermoplastic polyimide (TPI) can be obtained after reaction at 90-160° C. (preferably, 100-130° C.) for 3-5 hours. The molar ratio of the epoxy-containing silane to the polyimide is preferably between 1:1 and 1:3.

The intrinsic viscosity (I.V.) of the thermoplastic polyimide copolymer preferably exceeds 0.5 dl/g, more preferably between 0.6 and 0.8. The weight averaged molecular weight is typically between 10,000 and 100,000 and preferably between 20,000 and 60,000.

A small amount of inorganic additives may be added into the thermoplastic polyimide layer 120 to ensure that no curling occurs after copper foil etching. Suitable inorganic additives that may be used to reduce thermal expansion include silica, talc, calcium carbonate, clay, or combinations thereof. The amount of the inorganic additive is preferably between 0.1 and 5% by weight, based on the solid content of the polyimide.

Referring to FIG. 1, the fabrication of a double-sided flexible copper clad laminate using the thermoplastic polyimide of the invention is shown. First, the thermoplastic polyimide 110 of the invention is applied on both sides of a polyimide base film 100. The coating thickness is controlled at about 3-6 μm after baking at 120-250° C. Next, two copper foils 120 are laminated onto the thermoplastic polyimide layer 110, thereby completing a double-sided flexible copper clad laminate. The lamination is preferably carried out under conditions of 320-350° C. and 50-80 kg/cm$^2$ for less than 30 minutes, more preferably about 5-20 minutes.

According to a key feature of the invention, the thermoplastic polyimide of the invention has been modified before its application to the PI base film (i.e., during synthesis) and inherently provides superior adhesion without the need for further processing. In consequence, a thermal treatment carried out conventionally after lamination to increase adhesion is no longer required, thus saving processing time and costs. Furthermore, the double-sided flexible copper clad laminate made by the invention has superior heat resistance and dimensional stability, making it suitable for use in fine pitch circuits.

Without intending to limit it in any manner, the present invention will be further illustrated by the following examples.

SYNTHETIC EXAMPLE 1

In a three-neck flask purged with nitrogen, 11.44 g (40 mmol) of methylene bis(anthranilic acid) (MBAA) was dissolved in 182.5 g of NMP, followed by addition of 31.02 g (100 mmol) of 4,4'-oxydiphthalic anhydride (ODPA). After ODPA was dissolved, the mixture was stirred for 1 hour and then 24.63 g (60 mmol) of 2,2'-bis(4-[4-aminophenoxy]phenyl)propane (BAPP) was added and stirred at room temperature for 4 hours. Thereafter, 45 g of toluene was added and the mixture was heated to 155° C. to distill water-benzene azeotrope. After benzene was distilled out, the reaction temperature was raised to 180° C. and after 2 hours a viscous polyimide solution PI-1 was obtained by cooling. To 100 g of the polyimide solution PI-1 was added 3.6 g of γ-glycidoxypropyl-trimethoxysilane (KBM403 from Shin-Etsn Chemical Co., Ltd.) and 0.12 g of 10% TPP (in NMP). The resulting mixture was stirred at 120° C. for 2 hours, giving a viscous silane-modified thermoplastic polyimide solution TPI-1.

SYNTHETIC EXAMPLE 2

In a three-neck flask purged with nitrogen, 6.08 g (40 mmol) of 3,5-diaminobenzoic acid (DABZ) was dissolved in 156 g of NMP, followed by addition of 31.02 g (100 mmol) of ODPA. After ODPA was dissolved, the mixture was stirred for 1 hour and then 25.95 g (60 mmol) of 4,4'-bis(3-aminophenoxy)diphenyl sulfone (m-BAPS) was added and stirred at room temperature for 4 hours. Thereafter, 39 g of toluene was added and the mixture was heated to 155° C. to distill water-benzene azeotrope. After benzene was distilled out, the reaction temperature was raised to 180° C. and after 2 hours a viscous polyimide solution PI-2 was obtained by cooling. To 100 g of the polyimide solution PI-2 was added 1.8 g of γ-glycidoxypropyl-trimethoxysilane (KBM403 from Shin-Etsn Chemical Co., Ltd.) and 0.12 g of 10% TPP (in NMP). The resulting mixture was stirred at 120° C. for 3 hours, giving a viscous silane-modified thermoplastic polyimide solution TPI-2.

SYNTHETIC EXAMPLE 3

In a three-neck flask purged with nitrogen, 11.44 g (40 mmol) of MBAA was dissolved in 159 g of NMP, followed by addition of 52.05 g (100 mmol) of 4,4'-bisphenol A dianhydride (BPADA). After BPADA was dissolved, the mixture was stirred for 1 hour and then 24.63 g (60 mmol) of BAPP was added and stirred at room temperature for 4 hours. Thereafter, 40 g of toluene was added and the mixture was heated to 155° C. to distill water-benzene azeotrope. After benzene was distilled out, the reaction temperature was raised to 180° C. and after 2 hours a viscous polyimide solution PI-3 was obtained by cooling. To 100 g of the polyimide solution PI-3 was added 3.6 g of γ-glycidoxypropyl-trimethoxysilane (KBM403 from Shin-Etsn Chemical Co., Ltd.) and 0.12 g of 10% TPP (in NMP). The resulting mixture was stirred at 120° C. for 3 hours, giving a viscous silane-modified thermoplastic polyimide solution TPI-3.

COMPARATIVE SYNTHETIC EXAMPLE 1

To 100 g of the polyimide solution PI-1 was added 3.6 g of γ-glycidoxypropyl-trimethoxysilane (KBM403 from Shin-Etsn Chemical Co., Ltd.) and 0.12 g of 10% TPP (in NMP). The resulting mixture was stirred at room temperature, giving a viscous thermoplastic polyimide solution TPI-1B.

COMPARATIVE SYNTHETIC EXAMPLE 2

To 100 g of the polyimide solution PI-2 was added 1.8 g of γ-glycidoxypropyl-trimethoxysilane (KBM403 from Shin-Etsn Chemical Co., Ltd.) and 0.12 g of 10% TPP (in NMP). The resulting mixture was stirred at room temperature, giving a viscous thermoplastic polyimide solution TPI-2B.

COMPARATIVE SYNTHETIC EXAMPLE 3

To 100 g of the polyimide solution PI-3 was added 3.6 g of γ-glycidoxypropyl-trimethoxysilane (KBM403 from Shin-Etsn Chemical Co., Ltd.) and 0.12 g of 10% TPP (in NMP). The resulting mixture was stirred at room temperature, giving a viscous thermoplastic polyimide solution TPI-3B.

COMPARATIVE SYNTHETIC EXAMPLE 4

In a three-neck flask purged with nitrogen, 28.6 g (40 mmol) of MBAA was dissolved in 182 g of NMP, followed by addition of 31.02 g (100 mmol) of ODPA. After ODPA was dissolved, the mixture was stirred for 1 hour and then 24.63 g (60 mmol) of 2,2'-bis(4-[4-aminophenoxy]phenyl)propane (BAPP) was added. The resulting mixture was stirred at room temperature for 8 hours, giving a polyamic acid solution PAA-1.

EXAMPLES 1-3

The thermoplastic polymer solutions TPI-1, TPI-2, and TPI-3 of Synthetic Examples 1-3 were coated on both sides of a 1 mil thick PI base film, respectively. The coatings were baked at 120° C. for 5 minutes, 180° C. for 10 minutes, and then 250° C. for another 10 minutes, thus forming 5 μm thick thermoplastic polyimide films on both sides. Two copper foils (½Qz, F2-WS from Furukawa Circuit Foils Co., Ltd.) were superposed and laminated on the resulting thermoplastic polyimide films to yield double-sided copper clad laminates of Examples 1-3. The lamination was carried out at 350° C., 80 kg/cm² for 20 minutes. The peeling strength and solder resistance (288° C., 30 seconds) of the double-sided copper clad laminates are listed in Table 1, wherein the peeling strength was measured following the procedure of IPC-TM-650 (2.4.9), and the solder resistance was measured following the procedure of IPC-TM-650 (2.4.13).

COMPARATIVE EXAMPLES 1-4

The same procedure as in Examples 1-3 was repeated except that the thermoplastic polyimide solutions was replaced with the thermoplastic polyimide solutions TPI-1B, TPI-2B, and TPI-3B, and polyamic acid solution PAA-1 of Comparative Synthetic Examples 1-4. The peeling strength and solder resistance (288° C., 30 seconds) of the double-sided copper clad laminates are also listed in Table 1.

COMPARATIVE EXAMPLE 5

A commercial adhesiveless double-sided copper clad laminate BE1210 (from Ube Industries Co., Ltd.; PI=25 μm, ED Cu=18 μm) was measured for physical properties by the same procedure for comparison. The laminate had a three-layer structure of thermoplastic polyimide/polyimide base film/thermoplastic polyimide (UPILEX-VT).

TABLE 1

| | Ex. 1 | Ex. 2 | Ex. 3 | Com. Ex. 1 | Com. Ex. 2 | Com. Ex. 3 | Com. Ex. 4 | Com. Ex. 5 |
|---|---|---|---|---|---|---|---|---|
| Adding epoxy-containing silane by | reaction | reaction | reaction | blending | blending | blending | none | — |
| Peeling strength (lb/in) | 6.6 | 6.2 | 7.6 | 3.8 | 3.1 | 3.1 | 6.6 | 6.2 |
| Solder resistance (288° C. * 30 sec) | pass | pass | pass | pass | pass | pass | poor | pass |

As shown, in Examples 1-3, the copper clad laminates using the silane-modified thermoplastic polyimide of the invention exhibited excellent peeling strengths of above 6 lb/in and passed the solder resistance test at 288° C. for 30 seconds. In Comparative Examples 1-3, where the epoxy-containing silane was merely blended into the thermoplastic polyimide solution, the copper clad laminates passed the solder resistance test but had poor peeling strengths. In Comparative Example 4, where no epoxy-containing silane was added, the laminate showed good peeling strength but failed the solder resistance test.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermoplastic polyimide composition, comprising:
   a silane-modified polyimide (A); and
   a polar solvent (B), wherein the silane-modified polyimide (A) is obtained by a reaction of a polyimide (a) and an epoxy-containing silane (b), and the polyimide (a) comprises repeating units represented by formulae I and II,

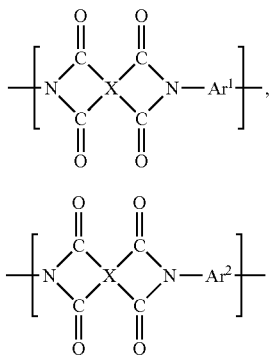

wherein the molar fraction of the repeating unit of formula II is at least 10%, X represents a quadrivalent aromatic group, $Ar^1$ represents a bivalent aromatic group, and $Ar^2$ represents a COOH— or OH-containing bivalent aromatic group, and wherein the reaction is caused by a COOH or OH group of $Ar^2$ and the epoxy-containing silane (b).

2. The thermoplastic polyimide composition as claimed in claim 1, wherein X represents at least one of the quadrivalent aromatic groups:

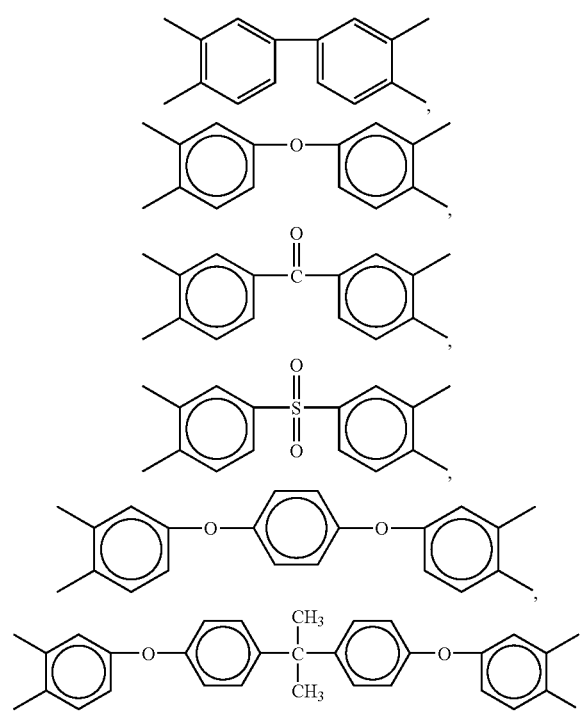

3. The thermoplastic polyimide composition as claimed in claim 1, wherein $Ar^1$ represents at least one of the bivalent aromatic groups:

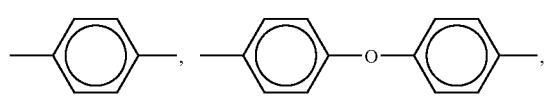

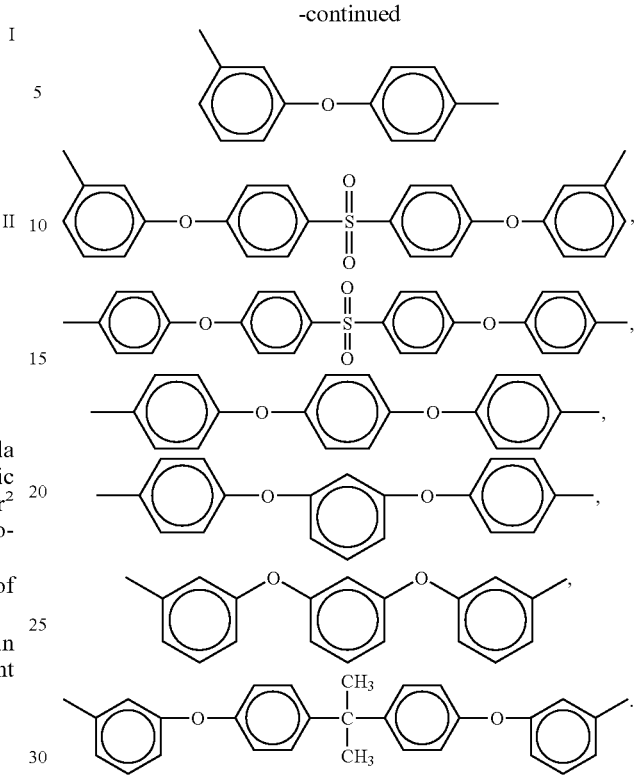

4. The thermoplastic polyimide composition as claimed in claim 1, wherein $Ar^2$ represents at least one of the COOH— or OH-containing bivalent aromatic groups:

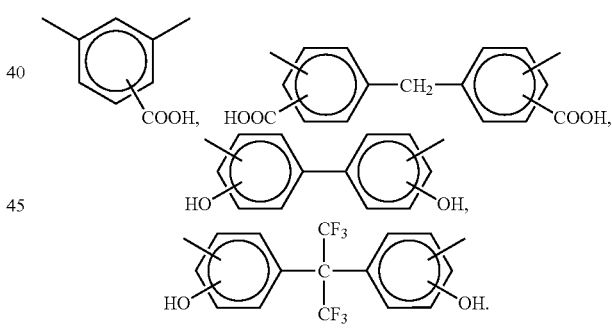

5. The thermoplastic polyimide composition as claimed in claim 1, wherein the molar fraction of the recurring unit of formula I in the polyimide (a) is about 30-60%.

6. The thermoplastic polyimide composition as claimed in claim 1, wherein the epoxy-containing silane (b) is a non-aromatic epoxy alkoxysilane.

7. The thermoplastic polyimide composition as claimed in claim 6, wherein the epoxy-containing silane (b) is epoxycyclohexyl alkoxysilane or glycidoxypropyl alkoxysilane.

8. The thermoplastic polyimide composition as claimed in claim 1, further comprising an inorganic additive.

9. The thermoplastic polyimide composition as claimed in claim 8, wherein the inorganic additive comprises at least one of silica, talc, calcium carbonate, and clay.

10. The thermoplastic polyimide composition as claimed in claim 1, wherein the silane-modified polyimide (A) has a solid content of about 15-30 wt %.

11. The thermoplastic polyimide composition as claimed in claim 1, wherein the polar solvent (B) comprises N-methyl-2-pyrrolidone (NMP), N,N-dimethylacetamide (DMAc), γ-butyrolactone (GBL), xylene, toluene, or combinations thereof.

12. The thermoplastic polyimide composition as claimed in claim 1, wherein the polar solvent (B) is N-methyl-2-pyrrolidone.

13. The thermoplastic polyimide composition as claimed in claim 1, wherein the epoxy-containing silane (b) is epoxy-cyclohexyl alkoxysilane.

* * * * *